United States Patent
Huang et al.

(10) Patent No.: US 9,947,606 B2
(45) Date of Patent: Apr. 17, 2018

(54) SEMICONDUCTOR DEVICE INCLUDING ELECTROMAGNETIC ABSORPTION AND SHIELDING

(71) Applicant: SanDisk Information Technology (Shanghai) Co. Ltd., Shanghai (CN)

(72) Inventors: Dacheng Huang, Shanghai (CN); Ye Bai, Shanghai (CN); Kaiyou Qian, Shanghai (CN); Chin-Tien Chiu, Taichung (CN)

(73) Assignee: SANDISK INFORMATION TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/395,027

(22) Filed: Dec. 30, 2016

(65) Prior Publication Data
US 2017/0110383 A1 Apr. 20, 2017

Related U.S. Application Data

(62) Division of application No. 14/348,828, filed as application No. PCT/CN2012/074737 on Apr. 26, 2012.

(30) Foreign Application Priority Data

Apr. 26, 2012 (WO) ................ PCT/CN2012/074737

(51) Int. Cl.
*H01L 23/552* (2006.01)
*H01L 23/31* (2006.01)
(Continued)

(52) U.S. Cl.
CPC .... *H01L 23/3135* (2013.01); *H01L 23/49811* (2013.01); *H01L 23/552* (2013.01);
(Continued)

(58) Field of Classification Search
CPC ... H01L 21/56; H01L 23/295; H01L 23/3135; H01L 23/49894; H01L 23/552;
(Continued)

(56) References Cited

U.S. PATENT DOCUMENTS 5,789,064 A   8/1998 Valente et al.
6,707,168 B1  3/2004 Hoffman et al.
(Continued)

FOREIGN PATENT DOCUMENTS

CN   1639866   7/2005
CN   1926682   3/2007
(Continued)

OTHER PUBLICATIONS

Response to Office Action filed Mar. 30, 2016 in Taiwan Patent Application No. 102105624.
(Continued)

*Primary Examiner* — Shahed Ahmed
(74) *Attorney, Agent, or Firm* — Vierra Magen Marcus LLP

(57) ABSTRACT

A semiconductor device is disclosed including material for absorbing EMI and/or RFI. The device includes a substrate, one or more semiconductor die, and molding compound around the one or more semiconductor die. The material for absorbing EMI and/or RFI may be provided within or on a solder mask layer on the substrate, or within a dielectric core of the substrate. The device may further include EMI/RFI-absorbing material around the molding compound and in contact with the EMI/RFI-absorbing material on the substrate to completely enclose the one or more semiconductor die in EMI/RFI-absorbing material.

15 Claims, 9 Drawing Sheets

(51) Int. Cl.
    *H01L 23/498*      (2006.01)
    *H01L 25/065*      (2006.01)
    *H01L 25/18*      (2006.01)

(52) U.S. Cl.
    CPC ...... *H01L 25/0657* (2013.01); *H01L 23/3121* (2013.01); *H01L 25/18* (2013.01); *H01L 2224/48091* (2013.01); *H01L 2224/48145* (2013.01); *H01L 2224/48147* (2013.01); *H01L 2224/48227* (2013.01); *H01L 2225/0651* (2013.01); *H01L 2225/06506* (2013.01); *H01L 2225/06537* (2013.01); *H01L 2225/06562* (2013.01); *H01L 2924/15311* (2013.01)

(58) Field of Classification Search
    CPC .......... H01L 24/97; H01L 2224/04042; H01L 2224/05554; H01L 2224/06155; H01L 2224/48145; H01L 2224/48147; H01L 2224/48227
    USPC .......... 257/422, 659, 660, 787, 790; 438/25, 438/112, 127, 731
    See application file for complete search history.

(56) References Cited

U.S. PATENT DOCUMENTS

| | | | |
|---|---|---|---|
| 7,288,728 B2 | 10/2007 | Koike | |
| 8,017,255 B2 | 9/2011 | Kawaguchi et al. | |
| 2004/0231872 A1 | 11/2004 | Arnold et al. | |
| 2005/0189910 A1 | 9/2005 | Hui | |
| 2005/0206015 A1 | 9/2005 | Salzman et al. | |
| 2007/0045818 A1 | 3/2007 | Kuan | |
| 2007/0056769 A1 | 3/2007 | Severance | |
| 2008/0157294 A1 | 7/2008 | Zeng et al. | |
| 2008/0318395 A1* | 12/2008 | Farnworth | B28D 5/0064 438/462 |
| 2009/0039515 A1 | 2/2009 | Farooq et al. | |
| 2009/0166819 A1* | 7/2009 | Chen | B82Y 30/00 257/659 |
| 2011/0298106 A1 | 12/2011 | Kim et al. | |
| 2012/0223231 A1* | 9/2012 | Nijaguna | G01J 5/04 250/338.1 |
| 2012/0261173 A1* | 10/2012 | Shen | H05K 1/0218 174/257 |
| 2013/0148401 A1 | 6/2013 | Fai | |

FOREIGN PATENT DOCUMENTS

| | | |
|---|---|---|
| CN | 101742814 | 6/2010 |
| TW | 201032298 A | 9/2010 |

OTHER PUBLICATIONS

Office Action dated Jul. 28, 2015 in Taiwan Patent Application No. 102105624.
Response to Office Action filed Jan. 23, 2015 in Taiwan Patent Application No. 102105624, and English translation of Claims as amended therein.
Office Action dated Oct. 21, 2014 in Taiwan Patent Application No. 102105624.
International Search Report and Written Opinion dated Jan. 31, 2013 in International Patent Application No. PCT/CN2012/074737.
Requirement for Restriction/Election dated Feb. 18, 2015 in U.S. Appl. No. 14/348,828.
Response to Election/Restriction dated Apr. 20, 2015 in U.S. Appl. No. 14/348,828.
Non-Final Rejection dated Jun. 30, 2015 in U.S. Appl. No. 14/348,828.
Amendment dated Sep. 29, 2015 in U.S. Appl. No. 14/348,828.
Final Rejection dated Nov. 30, 2015 in U.S. Appl. No. 14/348,828.
Amendment dated Feb. 26, 2016 in U.S. Appl. No. 14/348,828.
Notice of Allowance and Fees Due dated Oct. 28, 2016 in U.S. Appl. No. 14/348,828.
Office Action dated Jun. 20, 2017 in Chinese Patent Application No. 201280053715.2.
Response to Office Action filed Oct. 20, 2017 in Chinese Patent Application No. 201280053715.2, with English translation of claims.
Office Action dated Dec. 26, 2017 in Taiwan Patent Application No. 2102105624.
English language Abstract for TW201032298 published Sep. 1, 2010.

* cited by examiner

SEMICONDUCTOR DEVICE INCLUDING ELECTROMAGNETIC ABSORPTION AND SHIELDING

CLAIM OF PRIORITY

This application is a divisional application of U.S. patent application Ser. No. 14/348,828, filed Mar. 31, 2014, which application is a 371 of International Patent Application No. PCT/CN2012/074737, filed Apr. 26, 2012, which applications are incorporated by reference herein in their entirety.

BACKGROUND OF THE INVENTION

Field of the Invention

Embodiments of the present invention relate to semiconductor devices.

Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a stacked configuration. An edge view of a conventional semiconductor package 20 (without molding compound) is shown in prior art FIGS. 1 and 2. Typical packages include a plurality of semiconductor die 22, 24 mounted to a substrate 26. Although not shown in FIGS. 1 and 2, the semiconductor die are formed with die bond pads on an upper surface of the die. Substrate 26 may be formed of an electrically insulating core sandwiched between upper and lower conductive layers. The upper and/or lower conductive layers may be etched to form conductance patterns including electrical leads and contact pads. Wire bonds 30 are soldered between the die bond pads of the semiconductor die 22, 24 and the contact pads of the substrate 26 to electrically connect the semiconductor die to the substrate. The electrical leads on the substrate in turn provide an electrical path between the die and a host device. Once electrical connections between the die and substrate are made, the assembly is then typically encased in a molding compound to provide a protective package.

It is known to layer semiconductor die on top of each other either with an offset (prior art FIG. 1) or in a stacked configuration (prior art FIG. 2). In the offset configuration of FIG. 1, the die are stacked with an offset so that the bond pads of the next lower die are left exposed. The offset requires a greater footprint on the substrate, where space is at a premium. In the stacked configuration of FIG. 2, two or more semiconductor die are stacked directly on top of each other, thereby taking up less footprint on the substrate as compared to an offset configuration. However, in a stacked configuration, space must be provided between adjacent semiconductor die for the bond wires 30. In addition to the height of the bond wires 30 themselves, additional space must be left above the bond wires, as contact of the bond wires 30 of one die with the next die above may result in an electrical short. As shown in FIG. 2, it is therefore known to provide a dielectric spacer layer 34 to provide enough room for the bond wires 30 to be bonded to the die bond pad on the lower die 24.

As electronic components get smaller and operate at higher frequencies, the noise and cross talk caused by electromagnetic interference (EMI) and radiofrequency interference (RFI) is becoming more of a concern. EMI is the induction of electromagnetic radiation, which is emitted by electrical circuits carrying rapidly changing signals, as a by-product of their normal operation to other circuits, which causes unwanted signals (interference or noise). RFI is transmission of radiofrequency electromagnetic radiation from one circuit to another, also causing unwanted interference or noise.

Some semiconductor packages have attempted to shield the transmission and receipt of EMI and RFI radiation at the semiconductor package level. While preventing interference, these conventional solutions have other disadvantages which make inclusion of such features at the package level undesirable. Thus, shielding is typically performed at the host device level in which a semiconductor package is used. Host device level solutions typically involve providing a metal shield around the space where a semiconductor package is received or mounted. Instead of shielding, it is also known to absorb EMI and RFI. However, conventional absorptive solutions have not satisfactorily addressed EMI and/or RFI in a semiconductor package.

DETAILED DESCRIPTION

Embodiments will now be described with reference to FIGS. 3 through 18, which relate to a semiconductor package including EMI and RFI shielding and absorption. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom" and "upper" and "lower" as may be used herein are for convenience and illustrative purposes only, and are not meant to limit the description of the invention inasmuch as the referenced item can be exchanged in position.

Figure 1:
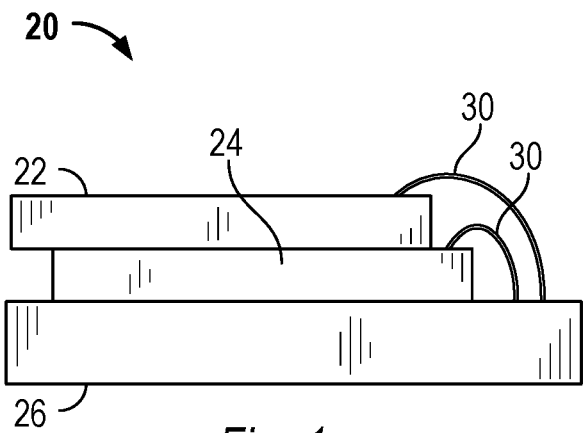
FIGS. 1 and 2 are prior art edge views of two conventional semiconductor package designs with the molding compound omitted.
Figure 2:
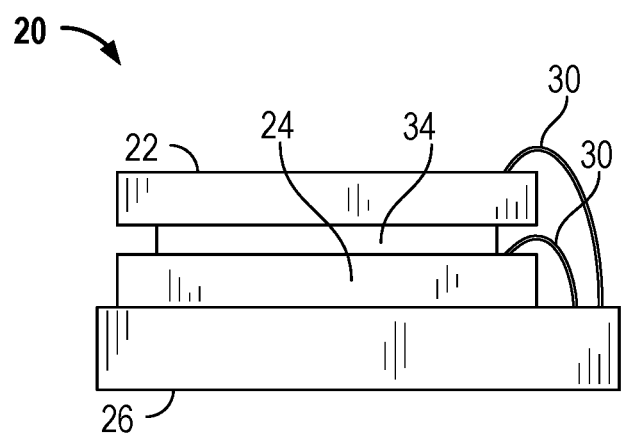
Figure 3:
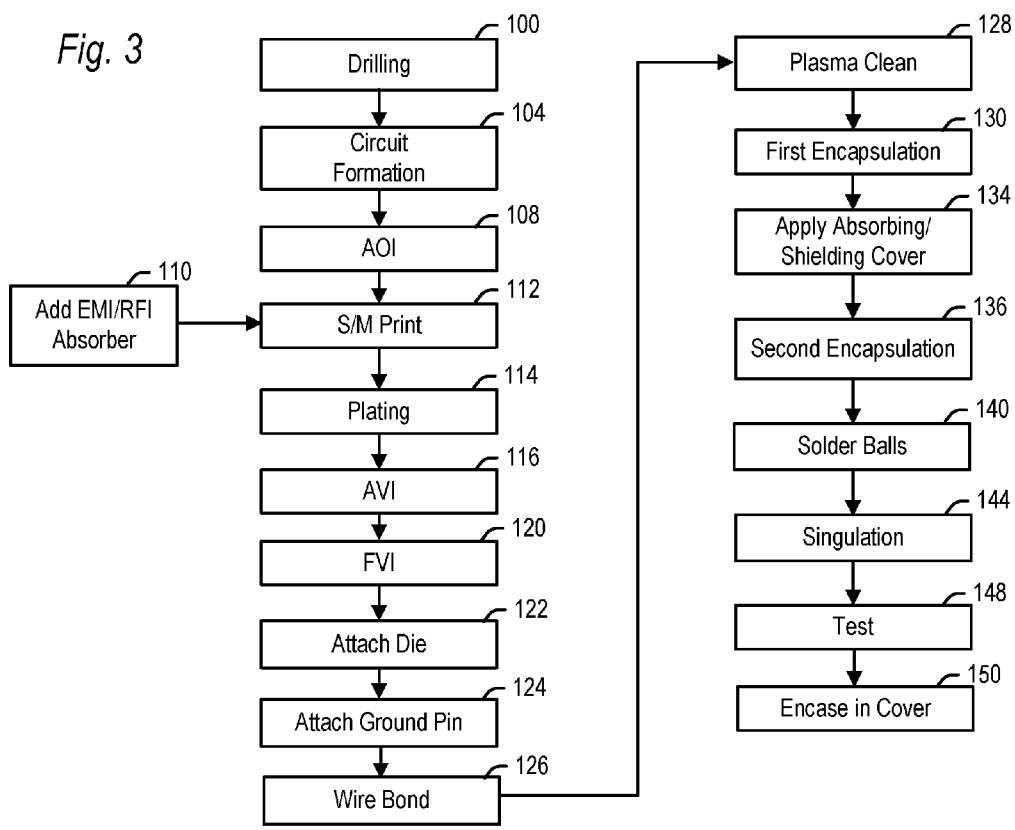
FIG. 3 is a flowchart showing the assembly of a semiconductor device according to the present disclosure.
Figure 4:
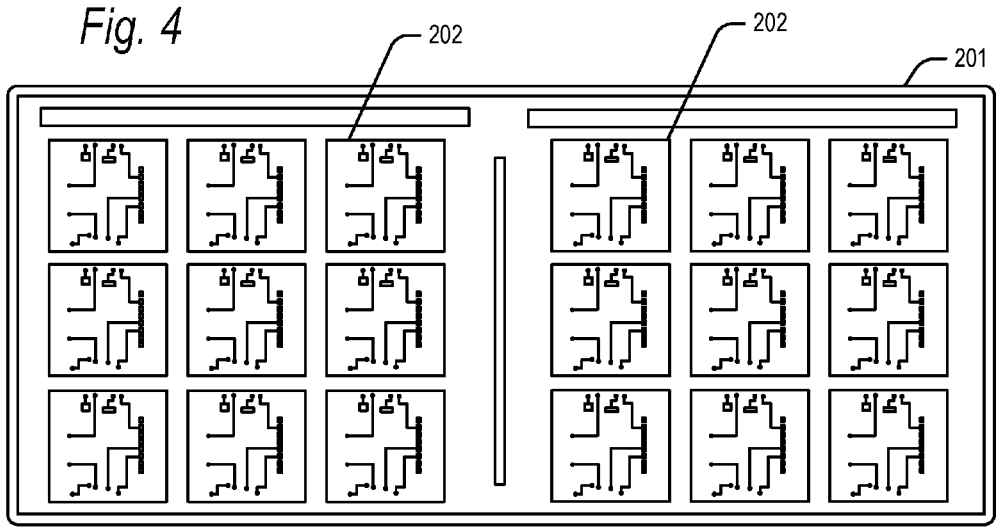
FIG. 4 is a top view of a substrate according to an embodiment of the present disclosure.

An embodiment of the present technology will now be explained with reference to the flowchart of FIG. 3, and the top and edge views of FIGS. 4 through 18. FIG. 4 is a top view of a substrate panel 201 including a plurality of substrates 202. Panel 201 allows batch processing of substrates 202 into a number of semiconductor devices 200 at the same time to achieve economies of scale. The number of rows and columns of substrates 202 on the substrate panel 201 is shown by way of example only and the number of rows and/or columns of substrates 202 may vary in further embodiments.

Figure 5:
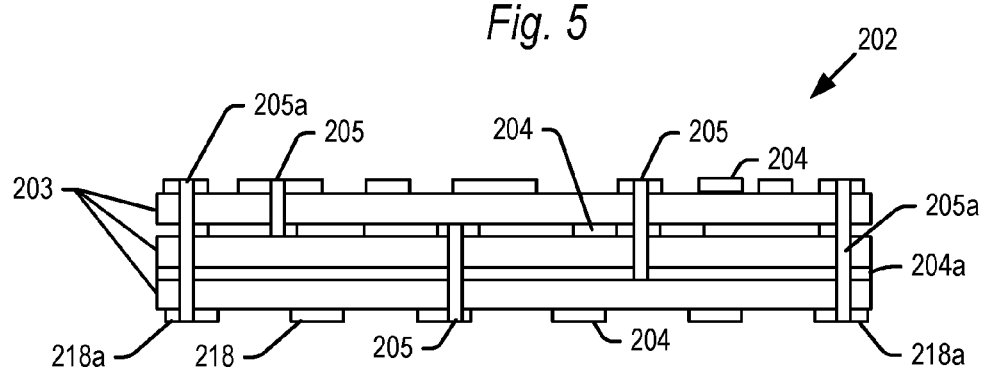
FIG. 5 is an edge view of a substrate according to an embodiment of the present disclosure.
Figure 6:
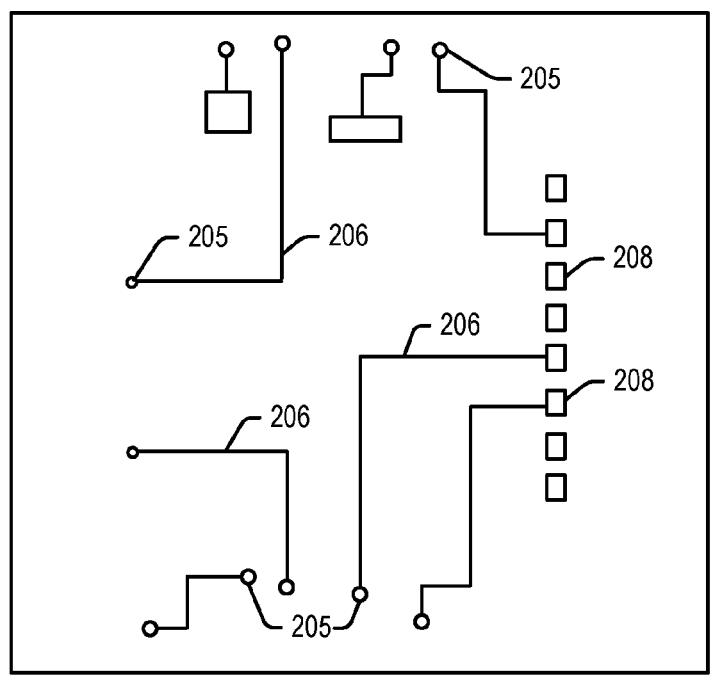
FIG. 6 is a top view of a substrate according to an embodiment of the present disclosure.
Figure 7:
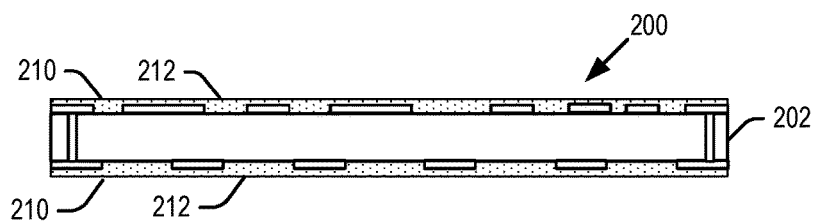
FIG. 7 is an edge view of a substrate including a solder mask having an EMI/RFI absorber according to an embodiment of the present disclosure.

An example of an individual substrate 202 is shown in edge and top views in FIGS. 5 and 6. The substrate 202 may be a variety of different chip carrier mediums, including a printed circuit board (PCB), a leadframe or a tape automated bonded (TAB) tape. Where substrate 202 is a PCB, the substrate may be formed of various conductive layers 204, each separated by a dielectric core 203. The edge views of FIGS. 7, 8, 10, 12, 14, 16 and 18 show a single core 203 surrounded by a pair of conductive layers for simplicity, but the substrate 202 in those figures may be the same as substrate 202 in FIG. 5. The number of layers in substrate 202 shown in FIG. 5 is by way of example only, and there may be more or less layers in further embodiments.

The core 203 may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although the thickness of the core may vary outside of that range in alternative embodiments. The core may be ceramic or organic in alternative embodiments. As explained below, an EMI/RFI absorber may be added or otherwise included as part of core 203.

The conductive layers 204 surrounding the core 203 may be formed of copper or copper alloys, plated copper or plated copper alloys, copper plated steel, or other metals and materials known for use on substrate panels. The conductive layers may have a thickness of about 10 μm to 25 μm, although the thickness of the conductive layers may vary outside of that range in alternative embodiments. As explained below, one of the conductive layers, for example layer 204a, may be used as a ground plane.

In a step 100, the substrate 202 is drilled to define through-hole vias 205 in the substrate 202. The vias 205 (some of which are numbered in the figures) are provided to communicate signals between different layers of the substrate 202. The number and positions of vias 205 shown are by way of example, and the substrate may include many more vias 205 than are shown in the figures, and they may be in different locations than are shown in the figures. As explained below, vias 205 include one or more vias 205a for coupling a grounding pin on a top surface of the substrate to the ground plane 204a, and a ground pad on a bottom surface of the substrate.

Conductance patterns may next be formed in one or more of the conductive layers 204 provided on the core(s) 203 in step 104. The conductance pattern in the top and bottom conductive layers 204 may be formed by various methods including for example by silk screening and by photolithography. An example of a conductance pattern is shown in the top layer in FIG. 6. It is understood that one or more of the remaining conductive layers may also have conductance patterns defined therein as well.

The conductance pattern(s) in the layers 204 of substrate 202 may include electrical traces 206 and contact pads 208 (some of which are numbered in the figures). The traces 206 and contact pads 208 shown are by way of example, and the substrate 202 may include more traces and/or contact pads than are shown in the figures, and they may be in different arrangements than are shown in the figures. Other structures may be provided in the conductance pattern such as for example test pins for testing the operation of the semiconductor device 200. The conductance pattern in the various conductive layers 204 of the substrate 202 may be formed by a variety of known processes, including for example various silk screening or photolithographic processes.

Referring again to FIG. 3, the substrate 202 may next be inspected in an automatic optical inspection (AOI) in step 108. Once inspected, a solder mask layer 210 may be applied to the upper and/or lower surfaces of the substrate 202 in step 112. The solder mask layer may serve multiple functions. In one example, the solder mask layer(s) are formed of a polymer that provides a protective coating for the copper traces of the conductance pattern and prevents solder from bleeding beyond the exposed contact pads and test pins, thereby preventing short circuits.

Additionally, in accordance with embodiments of the present technology, an EMI/RFI absorber 212 may be added to the solder mask material for absorbing EMI and RFI radiating within the semiconductor device 200 and radiating onto the semiconductor device 200 from external sources. In embodiments, the EMI/RFI absorber 212 (FIGS. 7 and 9) is formed as part of the solder mask in step 110 prior to application of the solder mask layer(s) 210 onto the substrate 202. However, as explained below with respect to FIG. 8, the EMI/RFI absorber 212 may be provided as a separate layer on the solder mask layer(s) 210 after application of the solder mask 210 to the substrate 202.

The EMI/RFI absorber 212 is added to the solder mask to attenuate the EMI/RFI by changing it into heat energy. In one example, the EMI/RFI absorber 212 may comprise magnetic particles such as ferrite. However, the absorber 212 may be a wide variety of other materials and compositions in further embodiments, including for example silicon carbide, carbon nanotube, magnesium dioxide, carbonyl iron powder, SENDUST (an alloy containing 85% iron, 9.5% silicon and 5.5% aluminum), iron silicide, magnetic alloys, magnetic flakes and powders, other materials, and combinations of these materials. The absorber 212 may or may not also include a thermally conductive material, such as for example aluminum nitride, boron nitride, iron, metallic oxides and combinations thereon. As the absorber 212 is formed as part of the solder mask applied over the conductance pattern, in embodiments the absorber 212 is an electrical insulator.

In embodiments, the EMI/RFI absorber 212 may be mixed together with the other materials used in the solder mask 210. In such embodiments, the absorber 212 may form 20% to 40% by volume of the solder mask. One composition provided in conventional solder mask is barium sulfate. In embodiments, the absorber 212 may partially or completely replace barium sulfate in the solder mask. Where the EMI/RFI absorber 212 is ferrite, the absorber may include ferrite strands having a length of up to approximately 30 μm, though the ferrite strands may be longer in further embodiments. These strands may be aligned with each other (generally parallel), or they may be randomly oriented with respect to each other.

In further embodiments, the EMI/RFI absorber 212 may be applied as a separate layer to the solder mask 210 prior to application of the solder mask to the substrate (so that the combination solder mask and absorber are applied to the substrate together). In such embodiments, the absorber 212 may be suspended in an elastomer, such as epoxy or silicone, and then applied to the solder mask material prior to application of the solder mask layer 210.

Where the solder mask is a liquid including the absorber 212, the solder mask may be printed onto the substrate. Where the solder mask is a dry film (including the absorber incorporated into the solder mask or applied as a separate layer to the solder mask), the solder mask may be laminated onto the substrate.

In embodiments, the absorber 212 effectively absorbs EMI/RFI over a frequency range of approximately 100 MHz to 10 GHz, which in examples are the frequencies radiated within semiconductor device 200. It is understood that the absorber 212 may be used to absorb EMI/RFI at frequencies above and below this range. Varying the type of particles used in the absorber, their size, density and the thickness of the solder mask layer 210 will vary the effectiveness and frequency range absorbed by absorber 212.

In embodiments, the solder mask layer 210 may be between 10 and 40 μm, though it may be thinner or thicker than that in further embodiments. Where the solder mask layer 210 is applied to both the upper and lower surfaces of substrate 202, the EMI/RFI absorber 212 may be provided in the upper solder mask layer 210, the lower solder mask layer 210 or both.

Figure 8:
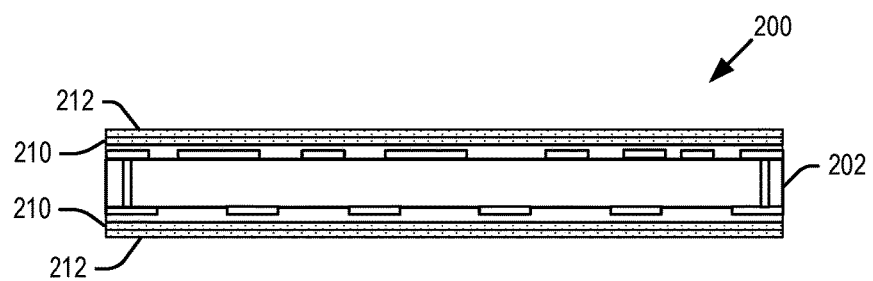
FIG. 8 is an edge view of a substrate including EMI/RFI absorbing layers provided on the solder mask layers according to an alternative embodiment of the present disclosure.
Figure 9:
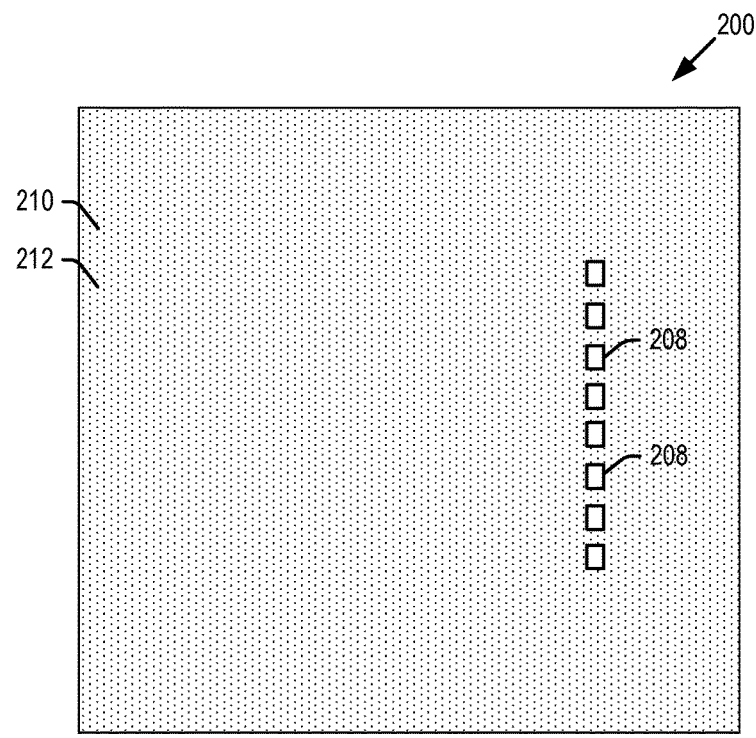
FIG. 9 is a top view of a substrate including EMI/RFI absorbing solder mask layers according to an embodiment of the present disclosure.

As indicated above, EMI/RFI absorber 212 may be applied in other places on the substrate instead of or in addition to the solder mask layer 210. For example, FIG. 8 shows an example where a layer of EMI/RFI absorber 212 may be applied over the solder mask layer 210 on an upper and/or lower surface of the substrate. In such embodiments, the absorber 212 may be provided as a liquid layer applied to the substrate 202 as by printing. Alternatively, absorber 212 may be suspended in an elastomer in the layer, such as epoxy or silicone, and then laminated onto the solder mask material after application of the solder mask layer 210.

In further embodiments, the EMI/RFI absorber may be incorporated into the core 203 of substrate 202 in addition to or instead of within solder mask layer 210 and/or on solder mask layer 210. In one such example, the EMI/RFI absorber 212 may comprise 50% to 70% by volume of the core 203, though the absorber within core 203 may be more or less than that in further embodiments.

After formation of the solder mask layer, the exposed portions of the conductance pattern (including for example contact pads 208) on the top layer and bottom layer may be plated with a Ni/Au layer or the like in step 114 in a known electrolytic plating, electro-less or thin film deposition process.

In step 116, the substrate 202 may be inspected and tested in an automated inspection process, and in step 120, the substrate may undergo a final visual inspection, to check electrical operation, and for contamination, scratches and discoloration.

Figure 10:
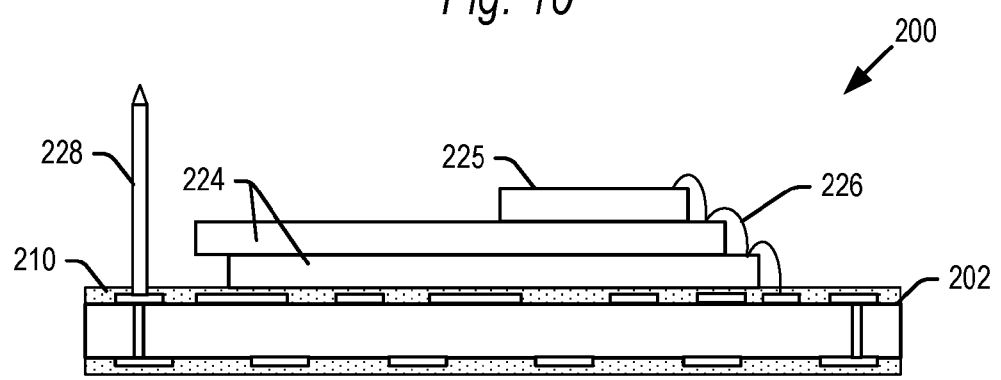
FIG. 10 is an edge view of a substrate including semiconductor die and a ground pin according to an embodiment of the present disclosure.
Figure 11:
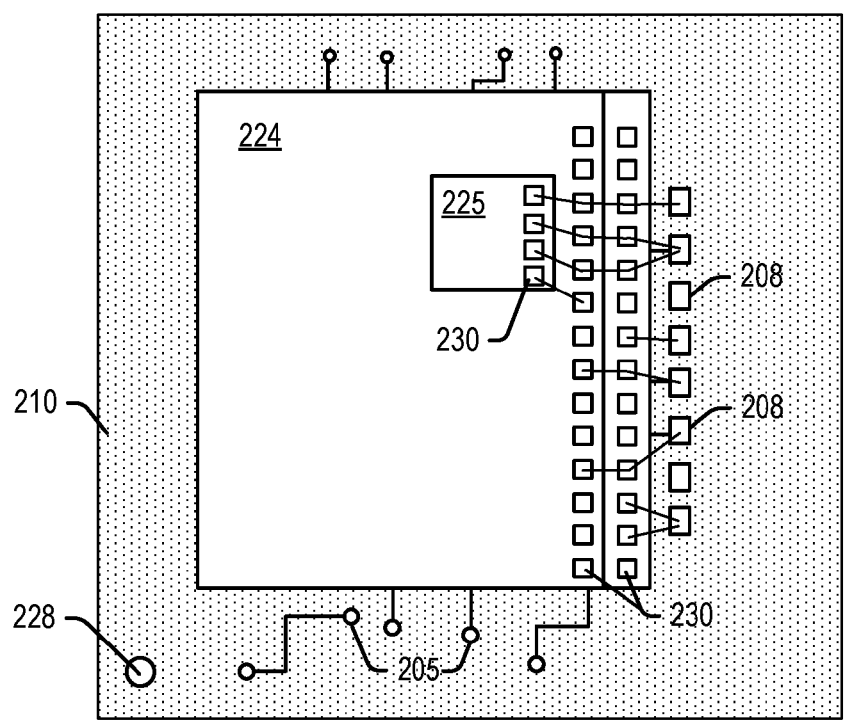
FIG. 11 is a top view of a substrate including semiconductor die and a ground pin according to an embodiment of the present disclosure.

Assuming the substrate 202 passes inspection, one or more semiconductor die may next be affixed to the top surface of the substrate 202 in a step 122 as shown in the edge and top views of FIGS. 10 and 11. The one or more semiconductor die may then be wire bonded to the substrate 202 in a step 126. In the illustrated example, the semiconductor device 200 includes a pair of memory die 224 and a controller die 225. The memory die 224 may for example be flash memory chips (NOR/NAND), though other types of memory die are contemplated. It is understood that a single memory die 224 may be provided and that more than two memory die may be provided. The controller die 225 may for example be an ASIC.

The wire bonds 226 may be connected between die bond pads 230 on the die 224, 225 and the contact pads 208 on the substrate 202. Only some of the die bond pads 230 and wire bonds 226 are shown and labeled. While the die bond pads 230 are shown along a single side of the die 224, 225 in the figures, it is understood that the die bond pads 230 and wire bonds 226 may be off multiple sides of the die 224, 225 to contact pads 208 adjacent multiple edges of the substrate 202.

Although not shown, one or more passive components may also be affixed and electrically coupled to the substrate 202. The one or more passive components may be mounted on the substrate 202 and electrically coupled to the conductance pattern as by connection to contact pads in known surface mount and reflow processes. The passive components may include for example one or more capacitors, resistors and/or inductors, though other components are contemplated.

Either before or after mounting of the semiconductor die 224, 225 and/or formation of the wire bonds 226, a ground pin 228 may also be affixed to the substrate in step 124. The ground pin may for example be soldered onto a contact pad on a top surface of the substrate 202, and connected to the ground plane 204a through a via such as for example via 205a. The ground pin may be formed of an electrical conductor, such as for example aluminum, and may be in the shape of a pin extending up from the substrate. In further embodiments, the ground pin 228 may instead be a flexible spring or clip extending up from the surface of substrate 202. As explained below, the ground pin 228 lies in contact with an EMI/RFI shield in the finished semiconductor device 200 to ground the shield.

In step 128, the semiconductor device 200 may undergo a plasma clean process to remove particulate and to improve the wettability of the surface to allow better flow properties of a molding compound used to protect the semiconductor die and wire bonds.

Figure 12:
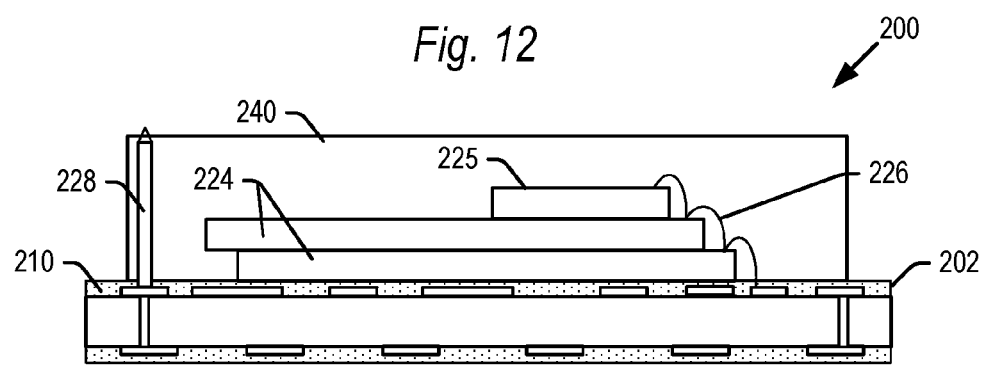
FIG. 12 is an edge view of a substrate including semiconductor die and a ground pin encapsulated during a first encapsulation process.
Figure 13:
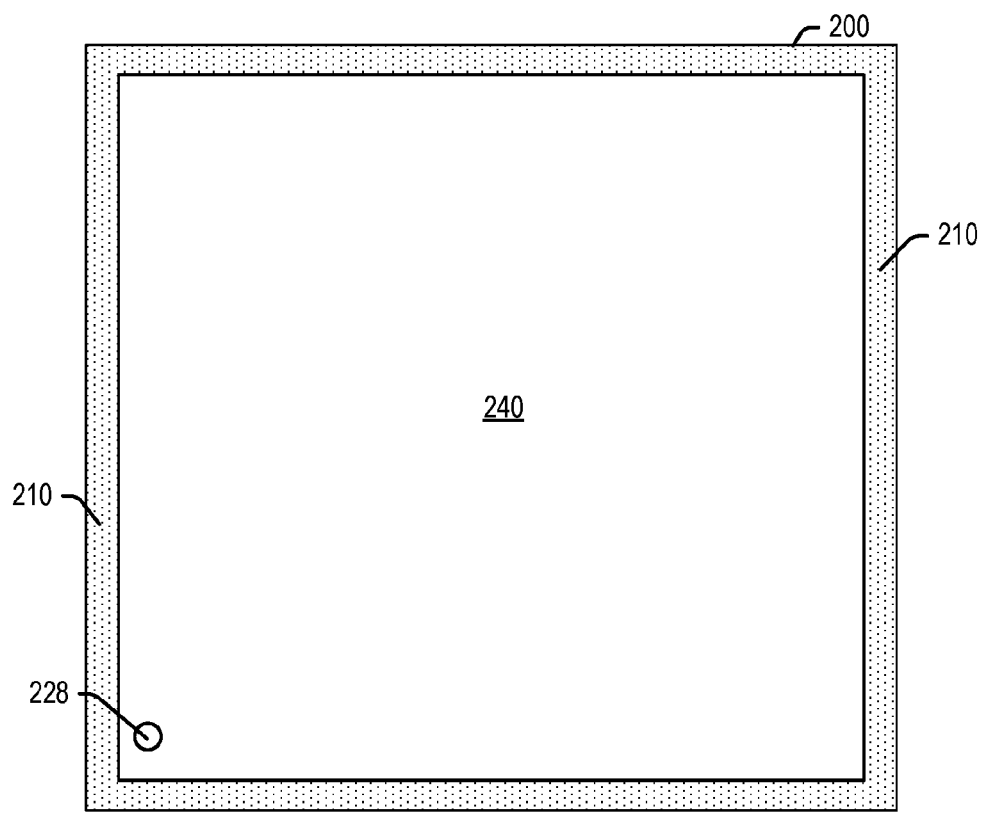
FIG. 13 is a top view of a substrate including semiconductor die and a ground pin encapsulated during a first encapsulation process.

After the die 224 have been mounted and wire bonded to the substrate, and the ground pin 228 affixed, the die 224, 225, wire bonds 226 and a portion of ground pin 228 may be encapsulated in a molding compound 240 in a first encapsulation step (step 130) as shown in the edge and top views of FIGS. 12 and 13. In embodiments, the molding compound 240 may be formed by transfer molding, using an epoxy known for example from Nitto Denko Corp. of Japan.

In a further embodiment, instead of transfer molding, the molding compound 240 encapsulation may be formed by FFT (Flow Free Thin) compression molding. Such an FFT compression molding process is known and described for example in a publication by Matsutani, H. of Towa Corporation, Kyoto, Japan, entitled "Compression Molding Solutions For Various High End Package And Cost Savings For Standard Package Applications," Microelectronics and Packaging Conference, 2009, which publication is incorporated by reference herein in its entirety. In general, an FFT compression machine makes use of a technique where the panel of substrates is immersed in a mold containing a molten resin.

Regardless of the type of encapsulation process, a top portion of the ground clip 228 is left protruding through the molding compound. The molding compound 240 may cover all of the semiconductor die 224, 225 and all of the substrate 202. Alternatively, the molding compound 240 may be applied in different configurations so that portions of the substrate 202 within the periphery of the shield ring are left devoid of molding compound.

Figure 14:
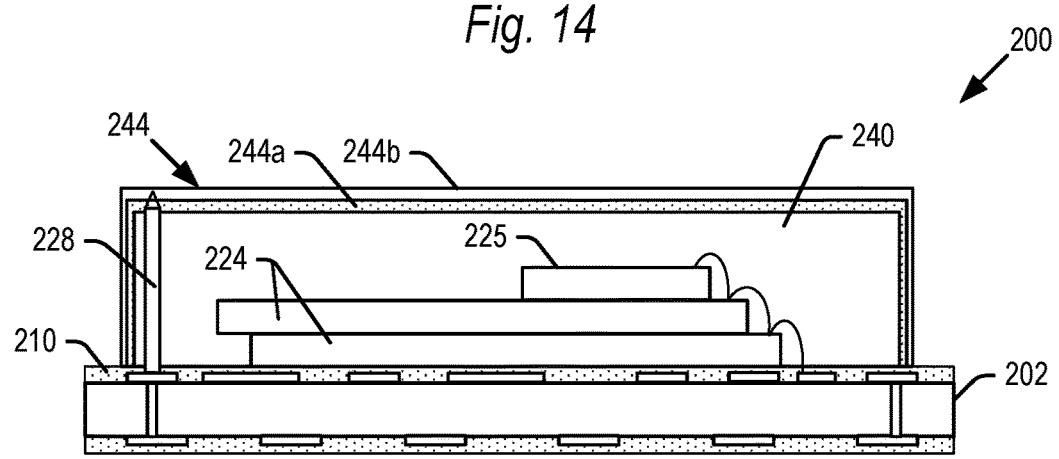
FIG. 14 is an edge view of a semiconductor device according to the present disclosure following application of EMI/RFI absorbing and shielding layers.
Figure 15:
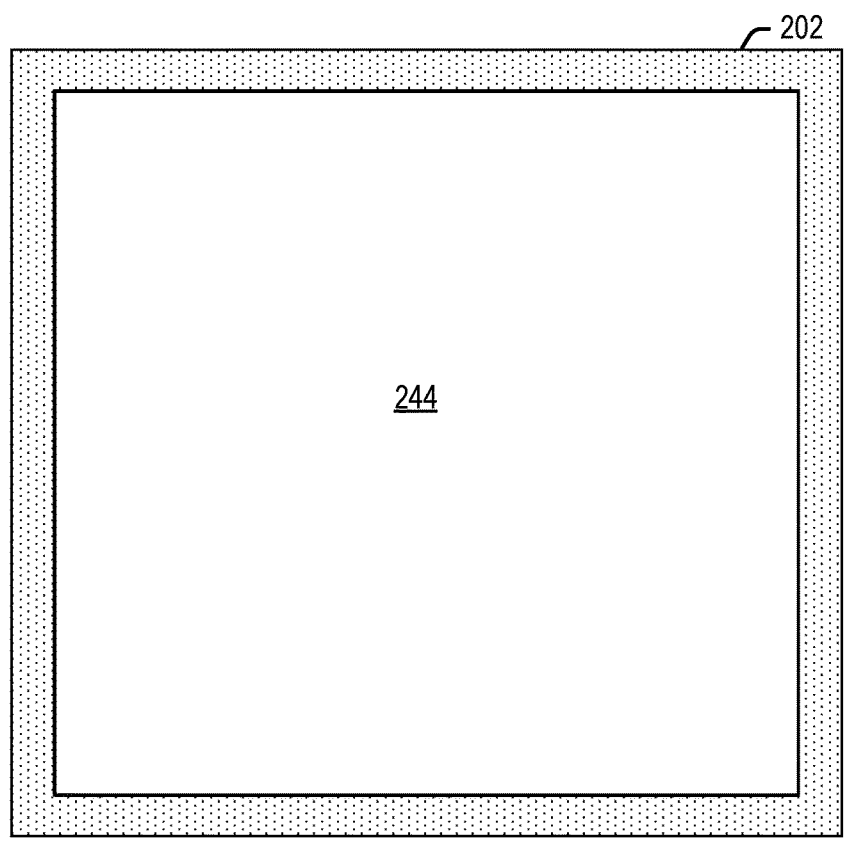
FIG. 15 is a top view of a semiconductor device according to the present disclosure following application of EMI/RFI absorbing and shielding layers.

Referring now to step 134 and the edge and top views of FIGS. 14 and 15, one or more layers of cover material 244 may be deposited on molding compound 240 following the first encapsulation process. In embodiments, the cover material 244 includes two separate layers. A first layer 244a may be an EMI/RFI absorber, such as in accordance with any of the embodiments for absorber 212 described above.

The first layer 244a may be applied over all surfaces of the molding compound, and down into contact with the solder mask layer 210, thus completely enclosing the semiconductor die 224, 225 and other components within semiconductor device 200 within EMI/RFI absorber 212. In further embodiments, the absorbing layer 244a may only be applied to a top surface of the molding compound 240, and not on the sides of the molding compound extending down to the substrate 202. The layer 244a may be printed or laminated onto the molding compound 240. In embodiments, the first layer 244a may have a thickness of a few microns to several hundred microns on the molding compound. The thickness may be greater or lesser than that in further embodiments.

A second layer of material 244 may be an EMI/RFI shield layer 244b. Where the absorbing layer 244a absorbs EMI/RFI and converts it to thermal energy, the shield layer 244b may reflect EMI/RFI. The shield layer 244b may be an electrical conductor, such as for example copper. The shield layer 244b may be comprised of copper plated onto the absorber layer 244a alone, or may be nickel-flash on top of copper. Other conductive plating materials may be used. For plating, nickel or copper may be plated first in an electro-less plating process as seed layer. The electro-less nickel or electro-less copper plating provides a seed layer, as is known in the PCB industry. The seed layer plating serves as an electrode to allow a subsequent electrolytic plating of copper or other metal, which is faster. The second layer 244b may have a thickness of several nanometers to hundreds of microns, depending in part on the deposition method. The layer 244b may be thicker or thinner than this in further embodiments.

The ground pin 228 is sized so as to lie within the shield layer 244b. Thus, the shield layer 244b is grounded to the ground plane 204a of the substrate 202.

As with layer 244a, the shield layer 244b may be plated on all surfaces of absorbing layer 244a and/or molding compound 240. Alternatively, the shield layer 244b may be provided on a top surface of the molding compound 240 (together with absorbing layer 244a) and not on the sides of the molding compound 240 extending down to the substrate 202.

Both layers 244a, 244b may be provided only on the top of molding compound 240, or both may extend down to the substrate. Alternatively, it may be that absorbing layer 244a is provided on the top and sides of molding compound 240 down to the substrate, but shield layer 244b is provided only on the top surface and not the sides. As a further alternative, it may be that shield layer 244b is provided on the top and sides of molding compound 240 down to the substrate but absorbing layer 244a is provided only on the top surface and not the sides. In the embodiment shown, the absorbing layer 244a is provided on the molding compound 240 and the shielding layer 244b is provided on the absorbing layer 244a. In an alternative embodiment, the position of the layers 244a, 244b may be switched so that the shielding layer 244b is provided on the molding compound 240 and the absorbing layer 244a is provided on the shielding layer 244b.

The absorbing material 212 in/on the substrate 202 together with the layers 244a, 244b of material 244 reduce EMI and/or RFI for the semiconductor device 200. In one example, the absorbing material 212 and material 244 may reduce interference by 15 dB for frequencies ranging from 100 MHz to 10 GHz. It is understood that the interference may be reduced more or less than that in this frequency range and other ranges in further embodiments.

Figure 16:
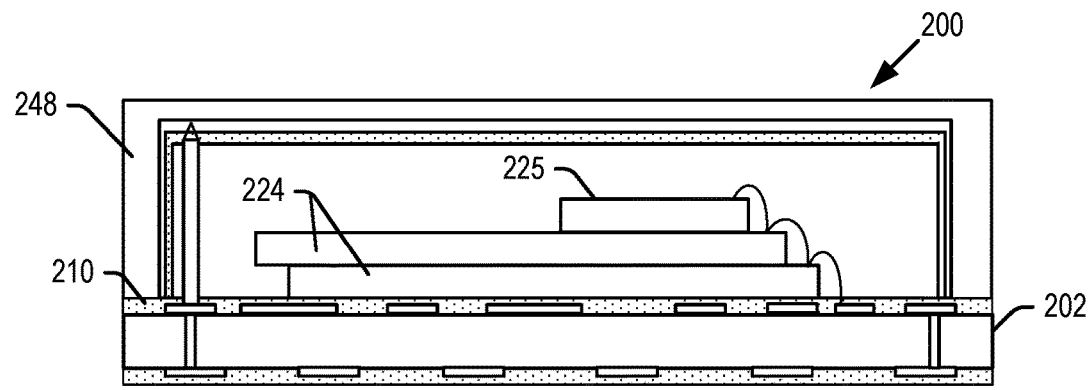
FIG. 16 is an edge view of a semiconductor device according to the present disclosure following a second encapsulation process.
Figure 17:
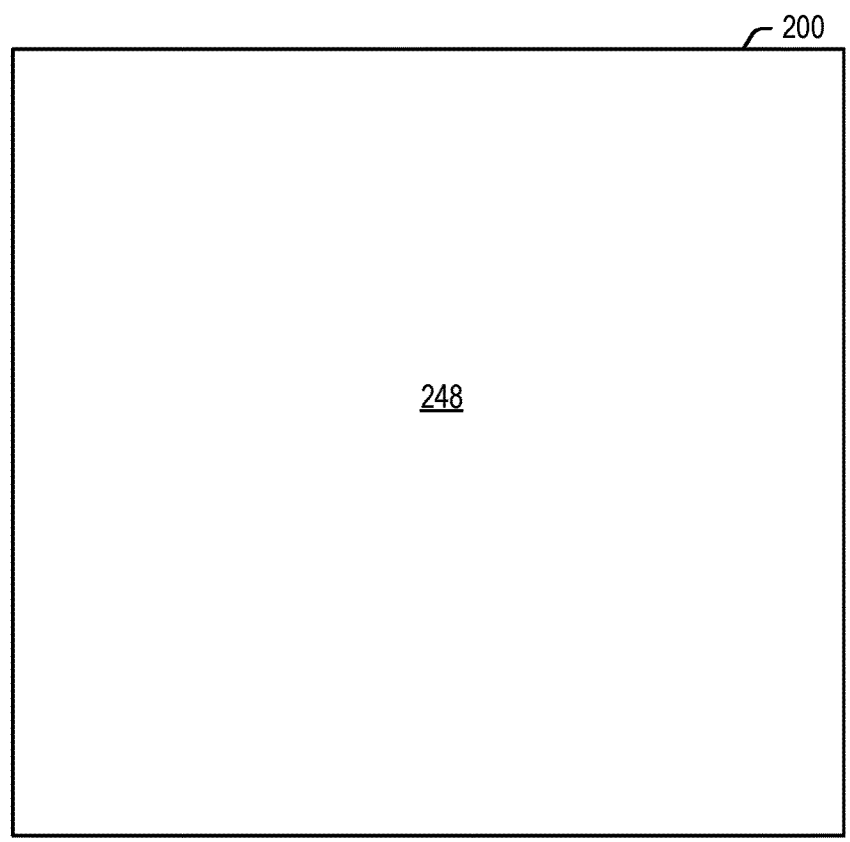
FIG. 17 is a top view of a semiconductor device according to the present disclosure following a second encapsulation process.

Referring now to the edge and top views of FIGS. 16 and 17, following the cover step, a second encapsulation process may be performed in step 136. This step may apply a molding compound 248 to completely encase the cover material 244 on the semiconductor device 200. The molding compound 248 may be any of the same materials as molding compound 240, and may be applied in any of the same processes used to apply molding compound 240. Molding compound 248 need not be the same as molding compound 240 in further embodiments, including for example FFT compression molding. While there are advantages to the second encapsulation process in step 136, it is understood that the second encapsulation process may be omitted in further embodiments, leaving the cover material 244 as the outer surface of the device 200.

Figure 18:
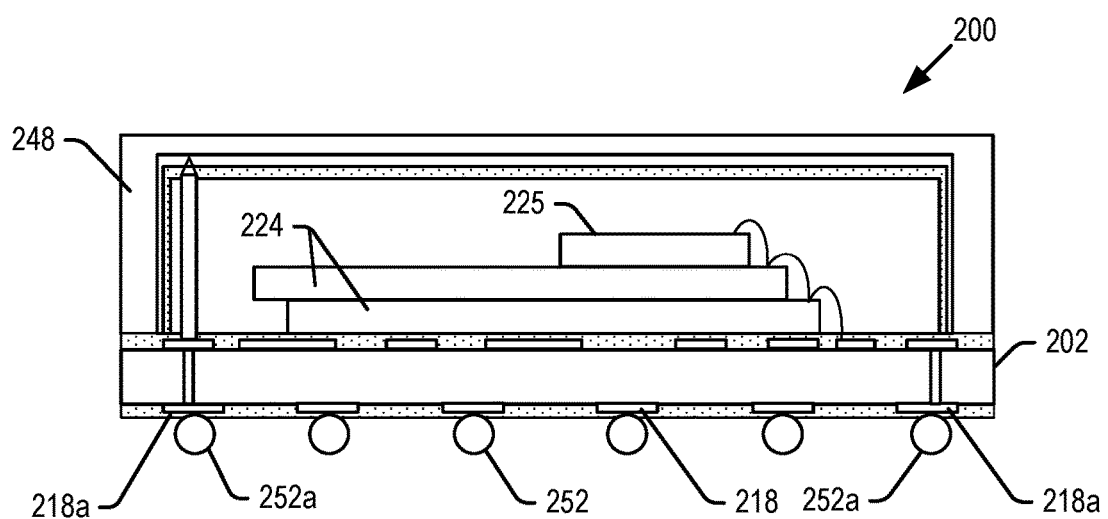
FIG. 18 is an edge view of a semiconductor device according to the present disclosure including a solder ball for attaching to a host device printed circuit board.

In step 140, solder balls 252 may be applied to contact pads 218 on the bottom surface of the semiconductor device 200, as shown in the edge view of FIG. 18. The solder balls allow the device 200 to be surface mounted to a PCB (not shown) in a host device. The contact pads 218 include ground pads 218a, which may each receive a solder ball 252a. The ground pin 228 may be coupled to a ground position on the PCB by vias 205a, ground pads 218a and solder balls 252a.

In further embodiments, the solder balls 252 including solder balls 252a may be omitted. For example, the semiconductor device 200 may be a land grid array (LGA) package which may be removably inserted into operative position in a host device. In such packages, the contact pads 218 on the bottom surface of the device 200 may be contact fingers. One or more of these contact fingers may be a ground finger designed to mate with a grounded connection in the host device. The ground pin 228 may be electrically coupled to such a ground finger in this embodiment.

After the solder balls are applied, or after the second encapsulation step where solder balls are omitted, the semiconductor devices 200 may be singulated from the panel 201 in step 144 to form the finished semiconductor device 200. Each device 200 may be singulated by any of a variety of cutting methods including sawing, water jet cutting, laser cutting, water guided laser cutting, dry media cutting, and diamond coating wire cutting. While straight line cuts will define a generally rectangular or square shaped device 200, it is understood that device 200 may have shapes other than rectangular and square in further embodiments of the present invention.

Once cut into devices 200, the devices may be tested in a step 148 to determine whether the packages are functioning properly. As is known in the art, such testing may include electrical testing, burn in and other tests. The devices may optionally be encased within a lid in step 150.

In summary, in one embodiment, the present technology relates to a semiconductor device, comprising: a substrate including a dielectric core, a conductive layer on the dielectric core, and a solder mask layer on the conductive layer, the substrate including an absorbing material for absorbing at least one of EMI and RFI; and one or more semiconductor die affixed to the substrate.

In another embodiment, the present technology relates to a semiconductor device, comprising: a substrate; a solder mask layer on the substrate, the solder mask layer including a first absorbing material for absorbing at least one of EMI and RFI; one or more semiconductor die affixed and electrically connected to the substrate; a molding compound encapsulating at least the one or more semiconductor die; and a layer provided on the molding compound, the layer including a second absorbing material for absorbing at least one of EMI and RFI.

In a further embodiment, the present technology relates to a semiconductor device, comprising: a substrate; a solder mask layer on the substrate, the solder mask layer including a first absorbing material for absorbing at least one of EMI and RFI; one or more semiconductor die affixed and electrically connected to the substrate; a molding compound encapsulating at least the one or more semiconductor die; and first and second layers provided on the molding compound, the first layer including a second absorbing material for absorbing at least one of EMI and RFI, and the second layer including a conductive material for shielding the semiconductor device against at least one of EMI and RFI.

In a still further embodiment, the present technology relates to a method of shielding a semiconductor device from at least one of EMI and RFI, comprising the steps of:
(a) mounting one or more semiconductor die on a substrate;
(b) encapsulating the one or more semiconductor die on the substrate in molding compound; and (c) completely encapsulating the one or more semiconductor die in one or more layers of absorbing material that absorb at least one of EMI and RFI.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of shielding a semiconductor device from at least one of EMI and RFI, comprising the steps of:
   (a) mounting one or more semiconductor die on a substrate;
   (b) encapsulating the one or more semiconductor die on the substrate in molding compound;
   (c) applying a first layer of material onto the molding compound, and applying a second layer onto the first layer, one of the first and second layers absorbing at least one of EMI and RFI, and the other of the first and second layers reflecting at least one of EMI and RFI.

2. The method of claim 1, further comprising the step of providing a layer of absorbing material for absorbing at least one of EMI and RFI on the substrate.

3. The method of claim 1, further comprising the step of providing a layer of absorbing material for absorbing at least one of EMI and RFI in a solder mask layer provided on the substrate.

4. The method of claim 1, wherein said step (c) comprises applying the first layer of absorbing material for absorbing at least one of EMI and RFI on the molding compound.

5. The method of claim 1, wherein said step (c) of applying the second layer onto the first layer comprises applying an electrically conductive shielding layer on the first layer for shielding the semiconductor device against at least one of EMI and RFI.

6. The method of claim 5, further comprising the step (e) of grounding the electrically conductive shielding layer to the substrate.

7. The method of claim 6, wherein said step (e) comprises the step of grounding the electrically conductive shielding layer to the substrate with a grounding pin mounted on the substrate and extending into contact with the electrically conductive shielding layer.

8. The method of claim 1, the method further comprising the step [d] of performing a second encapsulation step, subsequent to said steps (b) and (c) to apply molding compound around the first and second layers.

9. A method of shielding a semiconductor device from at least one of EMI and RFI, comprising the steps of:
   (a) mounting one or more semiconductor die on a substrate;
   (b) encapsulating the one or more semiconductor die on the substrate in molding compound;
   (c) encapsulating the molding compound in a layer of electrically conducting shielding material that reflects at least one of EMI and RFI; and
   (d) grounding the electrically conductive shielding layer to the substrate with a grounding pin mounted on the substrate and extending away from the substrate into contact with the electrically conductive shielding layer.

10. The method of claim 9, further comprising the step of providing a layer of absorbing material for absorbing at least one of EMI and RFI on the substrate.

11. The method of claim 9, further comprising the step of providing a layer of absorbing material for absorbing at least one of EMI and RFI in a solder mask layer provided on the substrate.

12. The method of claim 9, further comprising the step of providing a layer of absorbing material for absorbing at least one of EMI and RFI on the molding compound.

13. The method of claim 12, said step of applying the layer of electrically conducting shielding material comprises the step of applying the layer of electrically conducting shielding material onto the layer of absorbing material.

14. The method of claim 12, said step of applying the layer of electrically conducting shielding material comprises the step of applying the layer of electrically conducting shielding material onto the molding compound and applying the layer of absorbing material onto the layer of electrically conducting shielding material.

15. The method of claim 9, further comprising the step (e) of performing a second encapsulation step, subsequent to said steps (b) and (c) to apply molding compound around the layer of absorbing material and the layer of electrically conducting shielding material.

\* \* \* \* \*